(12) United States Patent
Xie

(10) Patent No.: US 8,330,448 B2
(45) Date of Patent: Dec. 11, 2012

(54) POWER SUPPLY TESTING SYSTEM

(75) Inventor: Ling-Yu Xie, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 292 days.

(21) Appl. No.: 12/765,588

(22) Filed: Apr. 22, 2010

(65) Prior Publication Data

US 2011/0163776 A1 Jul. 7, 2011

(30) Foreign Application Priority Data

Jan. 4, 2010 (CN) .......................... 2010 1 0300020

(51) Int. Cl.
*G01R 1/00* (2006.01)
*G01R 31/40* (2006.01)
*G01D 3/00* (2006.01)
(52) U.S. Cl. .................... 324/114; 324/764.01; 702/108
(58) Field of Classification Search .......... 324/114–115, 324/762.01–762.09, 764.01; 702/108, 117, 702/121
See application file for complete search history.

(56) References Cited

U.S. PATENT DOCUMENTS

| | | | | |
|---|---|---|---|---|
| 4,037,156 | A * | 7/1977 | Goujon et al. | 324/764.01 |
| 5,162,721 | A * | 11/1992 | Sato | 320/106 |
| 5,978,495 | A * | 11/1999 | Thomopoulos et al. | 382/124 |
| 6,014,611 | A * | 1/2000 | Arai et al. | 702/132 |
| 6,437,595 | B1 * | 8/2002 | Boorananut et al. | 324/762.02 |
| 7,313,244 | B2 * | 12/2007 | Ryoo et al. | 381/94.5 |
| 7,746,243 | B2 * | 6/2010 | Chen et al. | 340/660 |
| 8,004,272 | B2 * | 8/2011 | Jamieson et al. | 324/115 |
| 8,159,258 | B2 * | 4/2012 | Xie | 324/764.01 |
| 8,209,432 | B2 * | 6/2012 | Skog et al. | 709/234 |
| 8,274,297 | B2 * | 9/2012 | Kruse et al. | 324/537 |
| 2005/0195092 | A1 * | 9/2005 | Takahashi et al. | 340/692 |
| 2011/0187402 | A1 * | 8/2011 | Xie | 324/764.01 |

\* cited by examiner

*Primary Examiner* — Joshua Benitez Rosario
(74) *Attorney, Agent, or Firm* — Altis Law Group, Inc.

(57) ABSTRACT

A system for testing a conversion efficiency of a power supply unit includes a power meter, a plurality of switches, a multimeter, a microcontroller unit (MCU), a computer, and a signal conversion circuit for communicatively connecting the MCU to the computer. The power meter is capable of measuring an input power supplied to the power supply unit. The switches are powered on/off according to a sequence predetermined by the computer. The multimeter is configured to measure an output power of the power supply. The computer is capable of reading data measured from the power meter and the multimeter and calculating a conversion efficiency of the power supply unit.

9 Claims, 5 Drawing Sheets

POWER SUPPLY TESTING SYSTEM

This application is related to a co-pending U.S. patent application Ser. No. 12/576,855, filed on Oct. 9, 2009, entitled "Power Supply Testing System". The present application and the co-pending application are assigned to the same assignee.

BACKGROUND

1. Technical Field

The present disclosure relates to a testing system, and more particularly to a testing system for testing conversion efficiency of a power supply.

2. Description of Related Art

A typical testing system for testing conversion efficiency of a power supply unit (PSU) includes an AC source applied to the PSU, a power meter, a first multimeter, a second multimeter, a first rotary switch, a second rotary switch, a third rotary switch, and a DC electronic load. The switches S1, S2, S3 are one pole multi-way switches. The power meter is connected between the AC source and the PSU for measuring AC input power to the PSU. The PSU output power rails include: 12V, 12 VCPU (a power rail for CPU), 5V, 3.3V, −12V, and 5 Vaux (standby voltage of 5V). Each of the power rails' output from the PSU is supplied to the DC electronic load via a resistor. The first rotary switch can be switched from one conducting position to another. Thus, the first multimeter is capable of connecting to each of the power rails and measuring an effective output voltage of each of the power rails. The second and third rotary switches can be switched from one conduction position to another for connecting the second multimeter to each of the resistors in a parallel connection. Thus, an output current of each of the power rails can be calculated using the formula: I=U/R. An output power of each of the power rails can be calculated by the formula: P=UI. A total output power of the PSU equals the sum of all the output power of the power rails. The ratio of the total output power of the PSU to the AC input power can be calculated to determine whether the PSU achieves a standard conversion efficiency.

However, the typical testing system needs an operator to manually turn the rotary switches and record the current and voltage of each of the power rails, which is inefficient.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
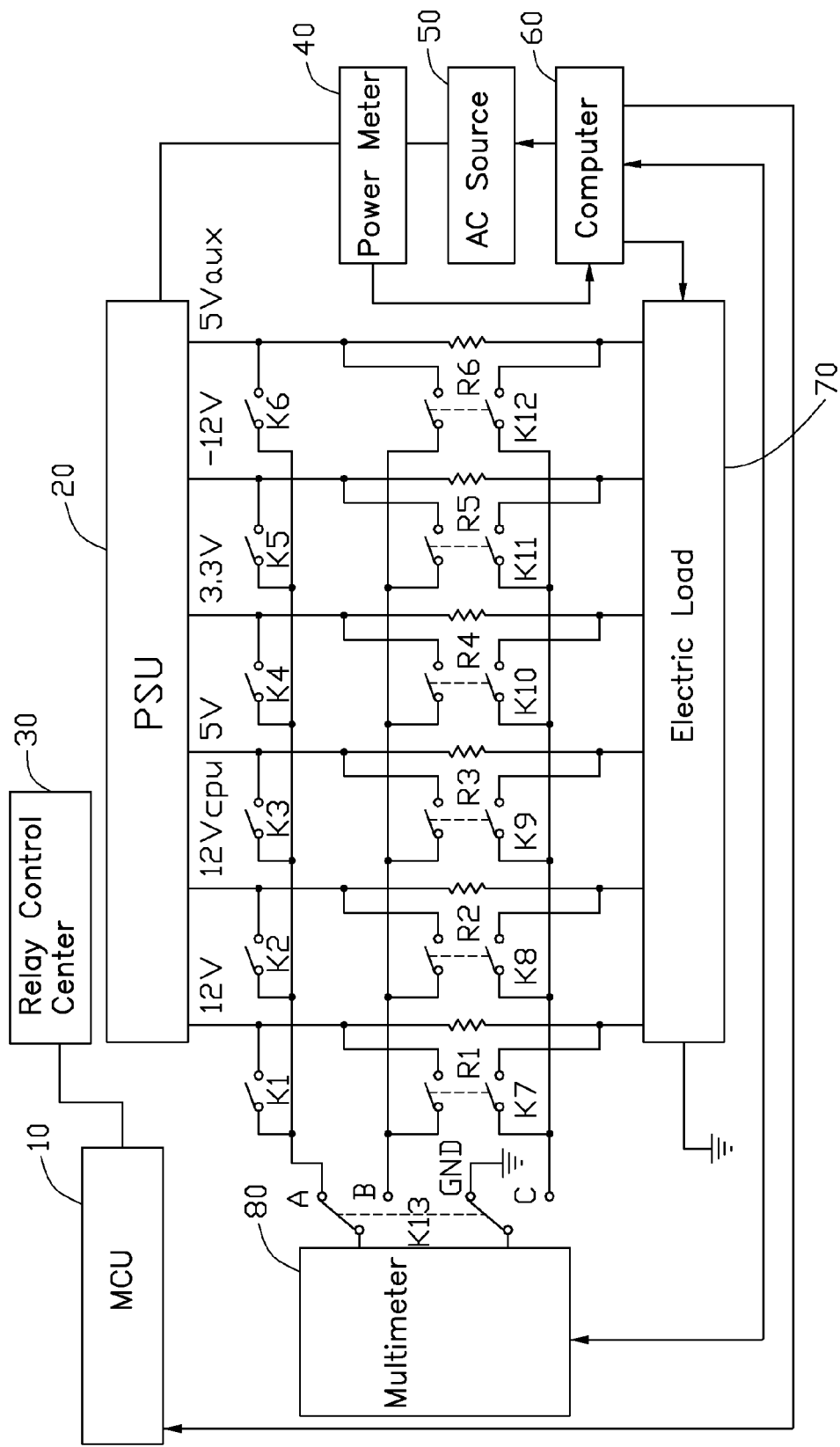
FIG. 1 illustrates a testing system for testing conversion efficiency of a power supply unit (PSU).
Figure 2:
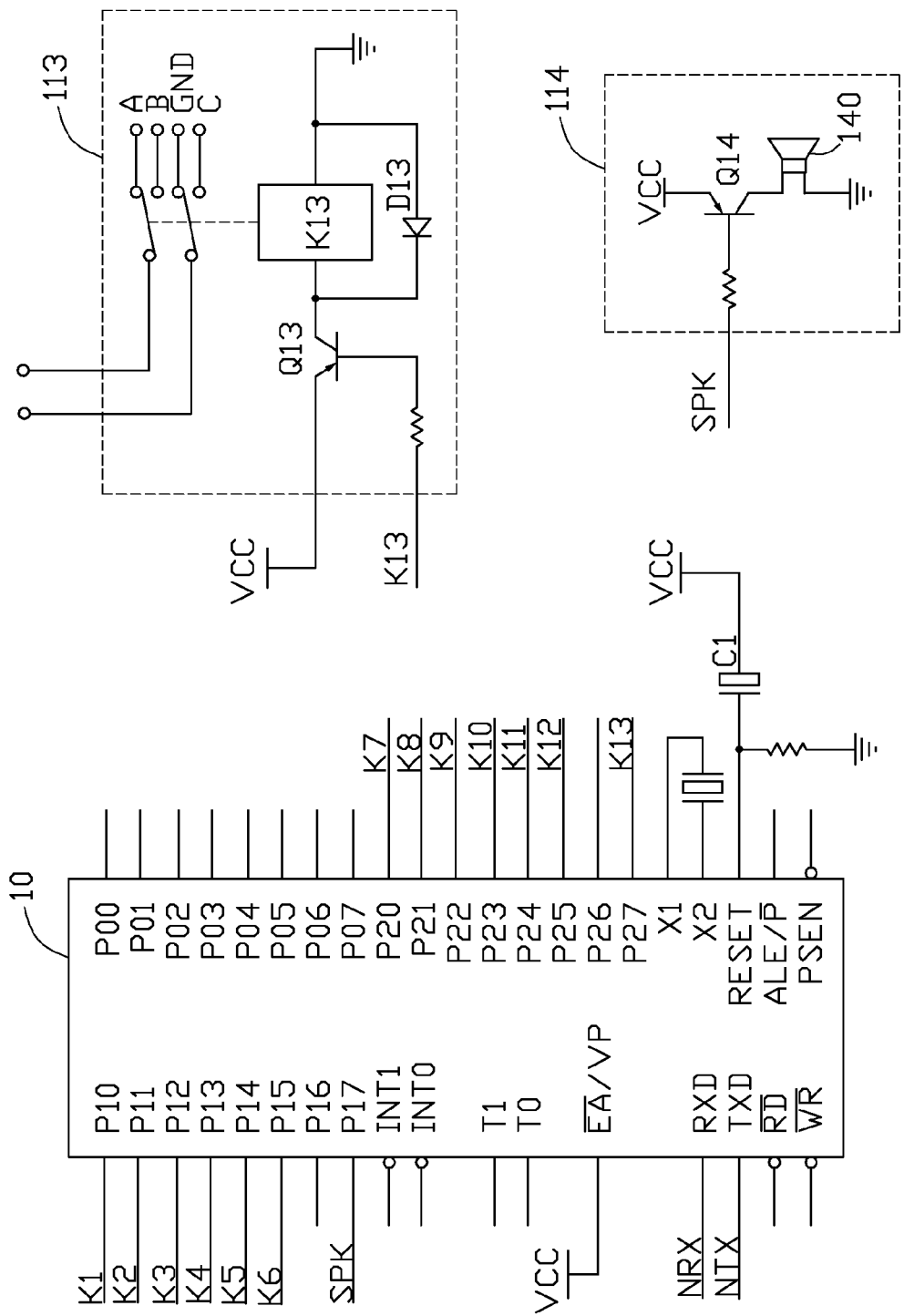
FIGS. 2-5 depict a single chip microcontroller (hereinafter MCU) and peripheral circuits coupled to the MCU of the testing system of FIG. 1.
Figure 3:
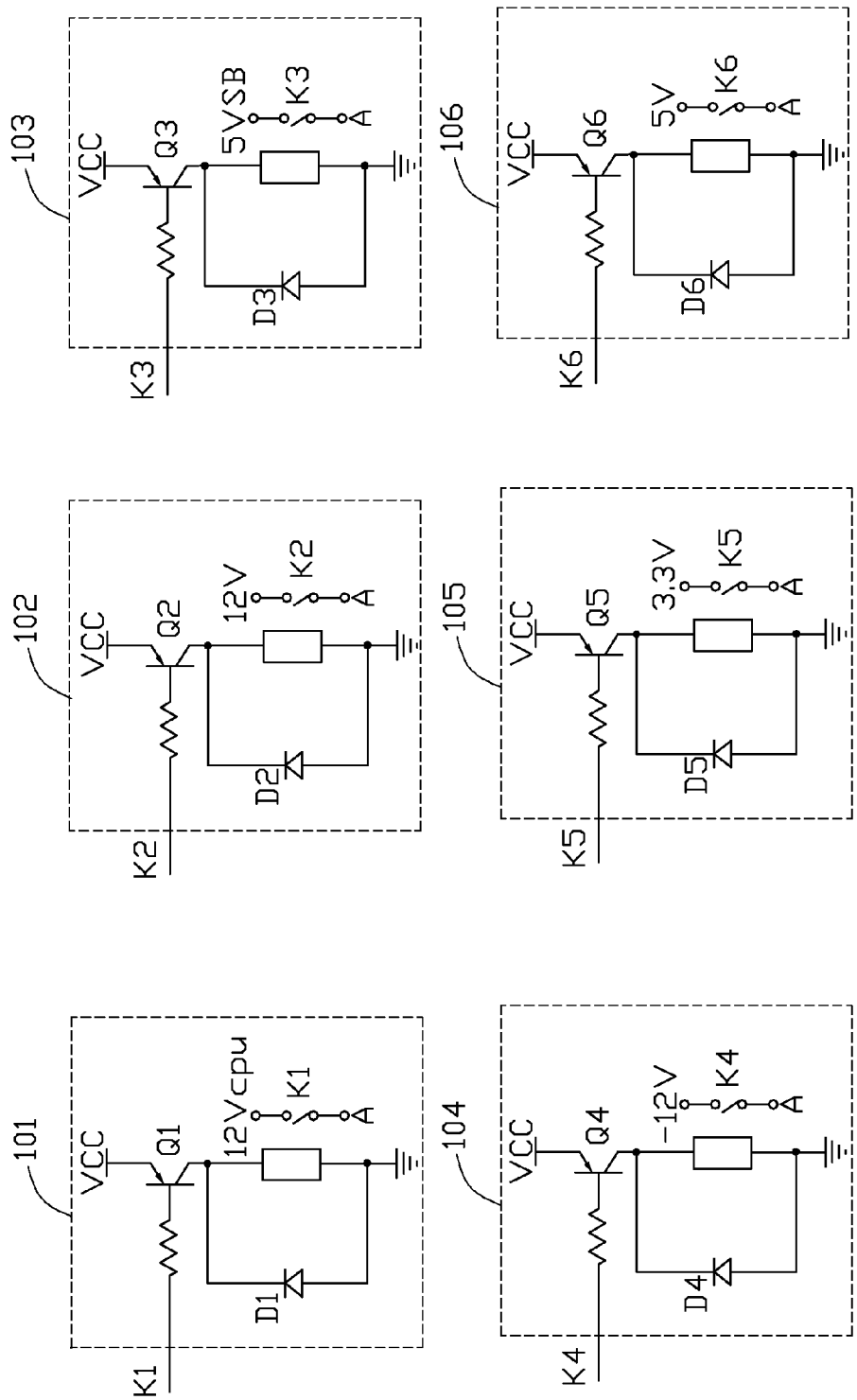
Figure 4:
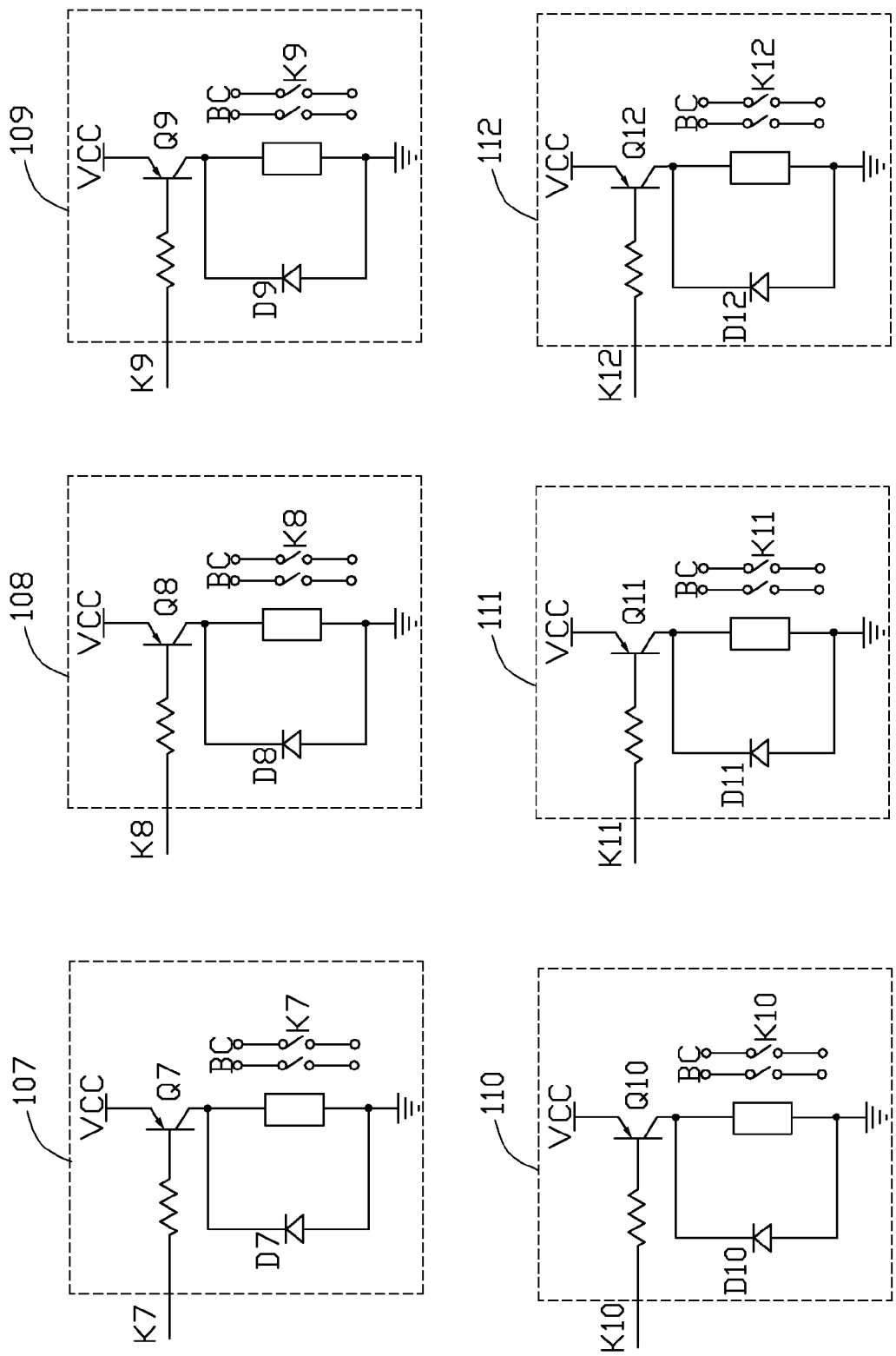
Figure 5:
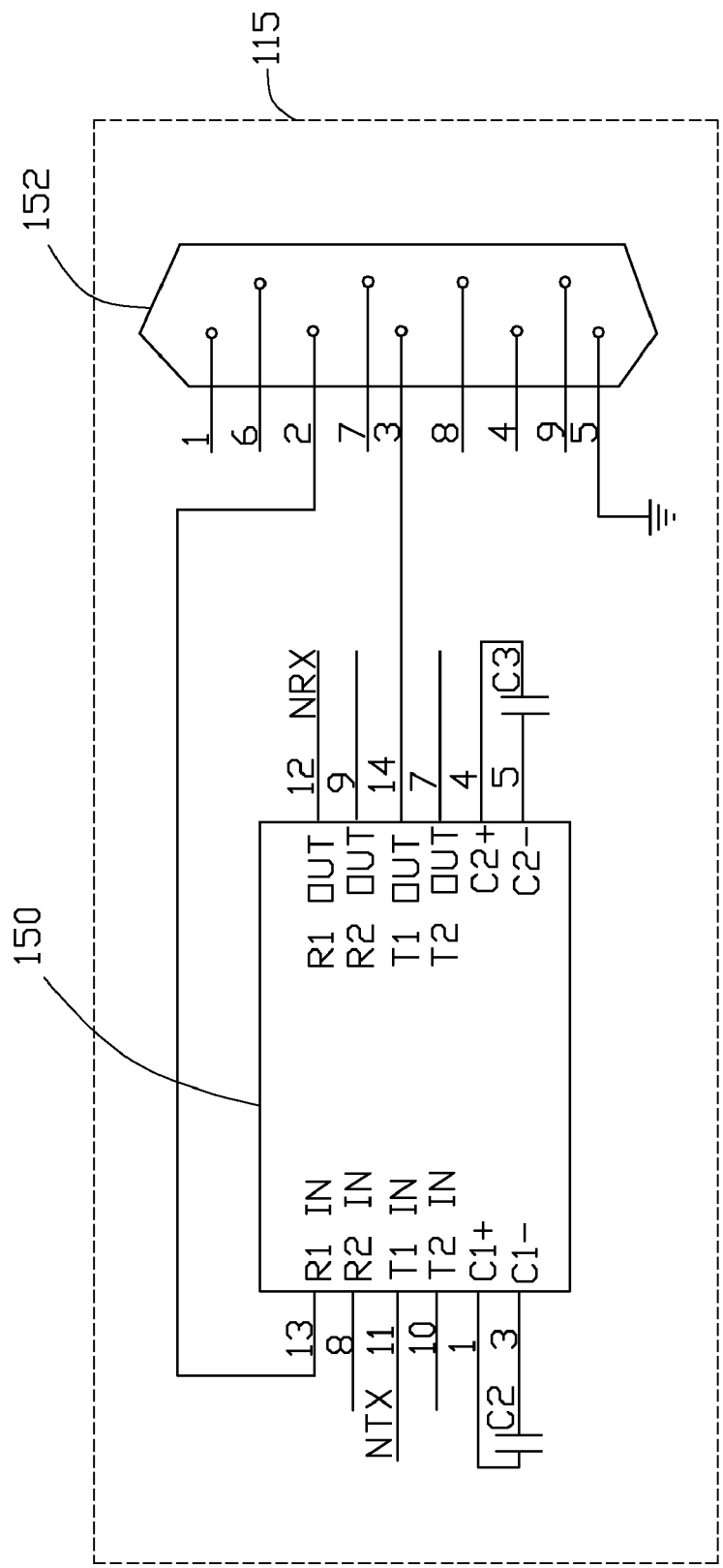

Referring to FIG. 1, an embodiment of a testing system for testing a conversion efficiency of a PSU 20 includes an MCU 10, a relay control center 30, a power meter 40, an AC source 50, a computer 60, an electronic load 70, a multimeter 80, and a plurality of switches K1-K13. The PSU 20 is capable of outputting power rails of 12V, 12V cpu, 5V, 3.3V, −12V, 5 Vaux respectively through connected resistors R1, R2, R3, R4, R5, R6. The power rails output from the PSU 20 are supplied to the electric load 70 via the resistors R1-R6. The computer 60 is connected to the AC source 50 for controlling an on/off state of the AC source 50 connected to the electric load 70 for controlling a resistance of the electric load 70, and connected to the MCU 10 for informing the MCU 10 to power on/off the switches K1-K13. The computer 60 is further connected to the power meter 40 and the multimeter 80 for receiving data from the power meter 40 and the multimeter 80 and then calculating a power conversion efficiency of the PSU 20.

The switches K1-K13 are relay switches. The MCU 10 controls the relay control center 30 for further controlling on/off states of the switches K1-K13. The switch K13 is a double pole-double throw switch. When the switch K13 is turned to connect a contact point A and ground in a first closed position, the multimeter 80 can measure an effective voltage of each of the power rails after each of the switches K1-K6 is closed in turn. For example, if the switch K13 is turned to connect the contact point A and ground (GND) and the switch K1 is closed, and the other switches are open, the multimeter 80 is connected to the 12V power rail and measures the effective voltage of the 12V power rail. If the switch K13 is turned to connect the contact point A and ground (GND) and the switch K2 is closed, and the other switches are open, the multimeter 80 can measure the effective voltage of the 12V cpu power rail.

When the switch K13 is turned to connect contact points B&C at a second closed position, the multimeter 80 can measure a voltage drop across each of the resistors R1-R6. For example, if the switch K13 is turned to connect contact points B&C and the switch K7 is turned to a closed position, keeping other switches open, the multimeter 80 and the resistor R1 are connected in parallel, and the multimeter 80 can measure the voltage drop across the resistor R1. A current flow through each of the resistors R1-R6 can be calculated using the formula: I=U/R. An output power of each of the power rails can be calculated using the formula: P=UI. Then a total output power of the PSU 20, equal to a sum of the output powers of all the power rails (P=P1+P2+P3+ . . . Pn), can be calculated.

An AC input power applied to the PSU 20 can be measured by the power meter 40. Thus, a ratio of the total output power to the AC input power can be calculated to determine conversion efficiency of the PSU 20.

Referring also to FIGS. 2 to 5, pins P10-P15 of the MCU 10 respectively connect to a first switch circuit 101, a second switch circuit 102, a third switch circuit 103, a fourth switch circuit 104, a fifth switch circuit 105, and a sixth switch circuit 106, for controlling on/off states of the switches K1-K6. Pins P20-P25 of the MCU 10 respectively connect to a seventh switch circuit 107, an eighth switch circuit 108, a ninth switch circuit 109, a tenth switch circuit 110, an eleventh switch circuit 111, and a twelfth switch circuit 112, for controlling on/off states of the switches K7-K12. A pin P27 of the MCU 10 is connected to a thirteenth switch circuit 113, for controlling the on/off state of the switch K13.

The first switch circuit 101 includes a first PNP bipolar junction transistor Q1, a first diode D1, and the switch K1. A base electrode of the transistor Q1 connects to the pin P10 of the MCU 10 via a resistor. An emitting electrode of the transistor Q1 is fed by a power source VCC. A collecting electrode of the transistor Q1 is connected to a cathode of the first diode D1. An anode of the first diode D1 is connected to ground. The switch K1 is a single pole-single throw relay switch and connected with the first diode D1 in parallel. When the pin P10 of the MCU 10 sends a high level signal to the base electrode of the transistor Q1, the transistor Q1 is rendered non-conductive; a voltage level of the collecting electrode of the transistor Q1 is low; and there is nearly no current flowing through a relay coil (not shown) of the switch K1, thereby keeping the switch K1 open. When the pin P10 of the MCU 10 sends a low level signal to the base electrode of the transistor Q1, the transistor Q1 is rendered conductive; a voltage level of the collecting electrode of the transistor Q1 is high; and there is an electric current (exceeding a threshold current to turn on the relay switch) flowing through the relay coil of the switches K1, thereby turning on the switch K1.

The second switch circuit 102 includes a second PNP bipolar junction transistor Q2, a second diode D2, and the switch K2. The switch K2 is a single pole single throw relay switch.

The third switch circuit 103 includes a third PNP bipolar junction transistor Q3, a third diode D3, and the switch K3. The switch K3 is a single pole single throw relay switch.

The fourth switch circuit 104 includes a fourth PNP bipolar junction transistor Q4, a fourth diode D4, and the switch K4. The switch K4 is a single pole single throw relay switch.

The fifth switch circuit 105 includes a fifth PNP bipolar junction transistor Q5, a fifth diode D5, and the switch K5. The switch K5 is a single pole single throw relay switch.

The sixth switch circuit 106 includes a sixth PNP bipolar junction transistor Q6, a sixth diode D6, and the switch K6. The switch K6, K12 is a single pole single throw relay switch.

The seventh switch circuit 107 includes a seventh PNP bipolar junction transistor Q7, a seventh diode D7, and the switch K7. The switch K7 is a double pole single throw relay switch.

The eighth switch circuit 108 includes an eighth PNP bipolar junction transistor Q8, an eighth diode D8, and the switch K8. The switch K8 is a double pole single throw relay switch.

The ninth switch circuit 109 includes a ninth PNP bipolar junction transistor Q9, a ninth diode D9, and the switch K9. The switch K9 is a double pole single throw relay switch.

The tenth switch circuit 110 includes a tenth PNP bipolar junction transistor Q10, a tenth diode D10, and the switch K10. The switch K10 is a double pole single throw relay switch.

The eleventh switch circuit 111 includes an eleventh PNP bipolar junction transistor Q11, an eleventh diode D11, and the switch K11. The switch K11 is a double pole single throw relay switch.

The twelfth switch circuit 112 includes a twelfth PNP bipolar junction transistor Q12, a twelfth diode D12, and the switch K12. The switch K12 is a double pole single throw relay switch.

The thirteenth switch circuit 113 (See FIG. 2) includes a thirteenth PNP bipolar junction transistor Q13, a thirteenth diode D13, and the switch K13. The switch K13 is a double pole double throw relay switch.

In one embodiment, a circuit connection and an operation principle of each of the second switch circuit 102, the third switch circuit 103, the fourth switch circuit 104, the fifth switch circuit 105, the sixth switch circuit 106, the seventh switch circuit 107, the eighth switch circuit 108, the ninth switch circuit 109, the tenth switch circuit 110, the eleventh switch circuit 111, the twelfth switch circuit 112, and the thirteenth switch circuit 113 are similar to that of the first switch circuit 101 described above.

An alarm circuit 114 is connected to a pin P17 of the MCU 10. The alarm circuit 114 includes a fourteenth bipolar junction transistor Q14 and a speaker 140 connected to the fourteenth transistor Q14. When the test ends, the speaker 140 generates audible signals.

A signal conversion circuit 115 (see FIG. 5) is connected to the MCU 10. The signal conversion circuit 115 includes a data conversion chip 150, e.g., a MAX 232 chip. Pin 13(R1 IN), pin 12(R1 OUT), pin 11(T1 IN), and pin 14(T1 OUT) is one data channel of the data conversion chip 150. Pin 8(R2 IN), pin 9(R2 OUT), pin 10(T2 IN), and pin 7(T2 OUT) is another data channel of the data conversion chip 150. Pin 11(T1 IN) of the data conversion chip 150 is connected to pin RXD of the MCU 10, and pin 12(R1 OUT) of the data conversion chip 150 is connected to PIN TXD of the MCU 10. Pin 13(R1 IN) and pin 14(T1 OUT) are connected to a serial port connector 152 of the computer 60. The MCU 10 can send signals to the computer 60 via pin 11(T1 IN) and pin 14(T1 OUT) of the data conversion chip 150, and the computer 60 can send signals to the MCU 10 via pin 13(R1 IN) and pin 12 (R1 OUT) of the data conversion chip 150. Signals sent from the MCU 10 are TTL level signals; the data conversion chip 150 is capable of converting the TTL level signals to serial signals, which are receivable by the serial port connector 152 of the computer 60. Signals sent from the serial port connector 152 of the computer 60 are serial signals; the data conversion chip 150 is capable of converting the serial signals to TTL level signals which are receivable by the MCU 10.

During testing, the PSU 10 is powered on and outputs the power rails. The power meter 40 measures the AC input power supplied to the PSU 10 and sends the measured data to the computer 60. The computer 60 informs the MCU 10 to switch on/off the switches K1-K13 according to a predetermined sequence. The multimeter 80 measures the effective output voltage of each of the power rails of the PSU 20, measures the voltage drop across each of the resistors R1-R6, and sends the measurements to the computer 60. The computer 60 stores data of the resistors R1-R7 and has processing capability to calculate the current flow of each of the power rails of the PSU 20 using the formula I=U/R, the total output power of the PSU 20, and the conversion efficiency of the PSU 20. Then the computer 60 compares the conversion efficiency of the PSU 20 with a standard ratio (such as 80%) and determines whether the conversion efficiency of the PSU 20 meets the standard.

It is to be understood, however, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the invention to the full extent indicated by the broad general meaning of the terms in which the appended claims are expressed.

The invention claimed is:

1. A system comprising:
a power supply unit supplied with an alternating current (AC) power source, the power supply unit capable of supplying a plurality of power rails to an electronic load;
a power meter connected between the AC power source and the power supply unit and capable of measuring an input power supplied to the power supply unit;
a plurality of switches;
a multimeter capable of connecting to each of the power rails via at least one of the plurality of switches for measuring an output power of each of the power rails;
a microcontroller unit (MCU) for automatically switching the plurality of switches for enabling the multimeter to measure the output power of each of the power rails;
a relay control center connected to the MCU and capable of controlling on/off states of the plurality of switches;

a computer respectively connected to the power meter, the multimeter, and the MCU, the computer capable of reading data measured from the power meter and the multimeter, informing the MCU to switch on/off the plurality of switches according to a predetermined sequence, and calculating a conversion efficiency of the power supply unit; and a signal conversion circuit connected between the MCU and the computer, the signal conversion circuit capable of converting signals sent from the computer to Transistor-Transistor Logic (TTL) level signals which are receivable by the MCU;

the plurality of switches comprises a double pole-double throw switch capable of switching from a first closed position to a second closed position.

2. The system of claim 1, wherein the signal conversion circuit comprises a signal conversion chip connected capable of converting serial signals to TTL level signals or converting TTL level signals to serial signals.

3. The system of claim 2, wherein the computer comprises a serial port connector connected to the signal conversion chip.

4. The system of claim 1, further comprising an alarm circuit connected to the MCU.

5. The system of claim 4, wherein the alarm circuit comprises a transistor connected to the MCU and a speaker connected to the transistor.

6. The system of claim 1, wherein the multimeter is capable of measuring an effective output voltage of each of the power rails of the power supply unit when the double pole-double throw switch is at the first closed position.

7. The system of claim 1, wherein the plurality of switches further comprises a single pole-single throw switch connected to each of the power rails; the multimeter is capable of measuring the effective output voltage of each of the power rails when the double pole-double throw switch is at the first closed position and the single pole-single throw switch is closed.

8. The system of claim 1, wherein each of the power rails is supplied to the electronic load via a resistor, the multimeter is capable of measuring a voltage drop across the resistor when the double pole-double throw switch is at the second closed position.

9. A system comprising:

a power supply unit supplied with an alternating current (AC) power source, the power supply unit is capable of supplying a plurality of power rails to an electronic load;

a power meter connected between the AC power source and the power supply unit and capable of measuring an input power fed to the power supply unit;

a plurality of switches;

a multimeter connected to the power supply unit, the multimeter capable of measuring an output power of each of the power rails of the power supply unit via at least one of the plurality of switches;

a microcontroller unit (MCU) connected with a plurality of switch circuits for automatically controlling a plurality of switches on/off according to a predetermined sequence;

a relay control center connected to the MCU and capable of controlling on/off states of the plurality of switches; and a computer respectively connected to the power meter, the multimeter, and the MCU, the computer capable of reading data measured from the power meter and the multimeter, informing the MCU to switch the plurality of switch circuits, and calculating a conversion efficiency of the power supply unit;

each of the switch circuits comprises a PNP bipolar junction transistor connected to the MCU, and a diode connected to the transistor;

each of the switch circuits further comprises at least a switch connected to the diode in parallel.

* * * * *